United States Patent

[11] 3,566,206

[72] Inventors Dirk J. Bartelink
Morris Township, Morris County;
Donald L. Scharfetter, Morristown, N.J.
[21] Appl. No. 785,547
[22] Filed Dec. 20, 1968
[45] Patented Feb. 23, 1971
[73] Assignee Bell Telephone Laboratories, Incorporated
Murray Hill, Berkeley Heights, N.J.

[54] NEGATIVE RESISTANCE SEMICONDUCTOR DEVICE HAVING A PINIPIN ZONE STRUCTURE

8 Claims, 4 Drawing Figs.

[52] U.S. Cl. 317/234, 317/235, 307/305
[51] Int. Cl. H01l 9/10, H01l 11/08, H01l 13/00, H01l 9/12, H01l 11/10
[50] Field of Search 317/235, (25), (28), (41), (43), (22.1), (22.11), 101(A)

[56] References Cited

UNITED STATES PATENTS

| | | | |
|---|---|---|---|
| 2,777,101 | 1/1957 | Cohen | 317/235 |
| 3,284,639 | 11/1966 | Giuliano et al. | 317/235X |
| 3,356,866 | 12/1967 | Misawa | 307/88.5 |
| 3,398,334 | 8/1968 | Shockley | 317/234 |
| 3,426,295 | 2/1969 | Loach et al. | 331/107 |

*Primary Examiner*—John W. Huckert
*Assistant Examiner*—W. Larkins
*Attorneys*—R. J. Guenterh and Arthur J. Torsiglieri ABSTRACT: A $P^+$ INIPIN$^+$ diode is operated as an avalanche diode to provide highly efficient negative resistance. Also, by connecting voltage sources to the intermediate N- and P-Zones, the devices may be used as an electronic switch.

INVENTORS D. J. BARTELINK
D. L. SCHARFETTER

BY D Caplan
ATTORNEY

NEGATIVE RESISTANCE SEMICONDUCTOR DEVICE HAVING A PINIPIN ZONE STRUCTURE

FIELD OF THE INVENTION

This invention relates to semiconductive apparatus which yields negative resistance, for use in an oscillator, amplifier, or an electronic switch.

BACKGROUND OF THE INVENTION

In U.S. Pat. issued to T. Misawa, No. 3,356,866 issued on Dec. 5, 1967 and having the same assignee as the present invention, there is described an impact ionization avalanche transit time, ne gative resistance device including a semiconductor diode with a PIPININ-conductivity-type zone structure. It should be understood that "I" denotes a zone of relatively lower conductivity, typically by at least a factor of ten, than the adjacent zones. However, due to the fact that such a device (as does the class of impact ionization transit time devices in the prior art generally) is characterized by a relatively high electric field in the drift region at all times, the efficiency attainable is relatively small, typically between 10 percent and 20 percent.

In view of the fact that negative resistance diodes have a wide range of application in amplifiers, oscillators, and parametric devices, it is important to have a negative resistance diode, with a substantially higher efficiency than the prior art.

SUMMARY OF THE INVENTION

According to this invention, a semiconductor diode with a PINIPIN-conductivity-type zone structure is operated as a negative resistance avalanche device. Typically, the outer end zones, P and N, have a lower resistivity than any of the intermediate, P- or N-type, zones by a factor of at least ten. For this reason, the zone structure of the diode in this invention typically can be denoted by P+INIPIN+, in which P+ or N+ denotes a zone having a resistivity at least a factor of ten lower than a P- or N-type on zone respectively without superscript. Moreover, the zones noted by I are "intrinsic" or "semi-intrinsic," having a resistivity which is at least a factor of ten higher than a P- or N-type zone.

In one embodiment of this invention, a P+INIPIN+ diode is subjected to a reverse voltage bias across the outer end zones, i.e., the P+ and N+ zones. As the bias is increased, avalanches are produced in the two intermediate I-zones immediately adjacent to the end zones. Due to the electric field produced in the diode by the voltage bias, electrons created in the avalanche in one of these I-zones and holes created in the other are propelled into the central I-zone, across which both said electrons and holes drift. However, due to the properties to of avalanching in semiconductors and the effect of the intermediate N- and P-zones upon the electric field profile, as the reverse voltage bias across the two said intermediate I-zones is slowly increased to create avalanche, the total current rapidly increases, while the electric field in the central I-zone decreases. Thereby, the voltage drop across the central I-zone also decreases, and net negative differential resistance results. Hence, the power loss therein is reduced and highly efficient negative resistance is achieved from the standpoint of power output.

DESCRIPTION OF THE DRAWING

This invention, together with its features, objects and advantages, may better be understood from the following detailed description when read in conjunction with the drawings (not to scale) in which.

It should be understood that the semiconductor structures 10 and 40 are not drawn to scale, the widths of the various zones having been grossly exaggerated in the $x$ direction for purposes of clarity.

DETAILED DESCRIPTION

Figure 1:
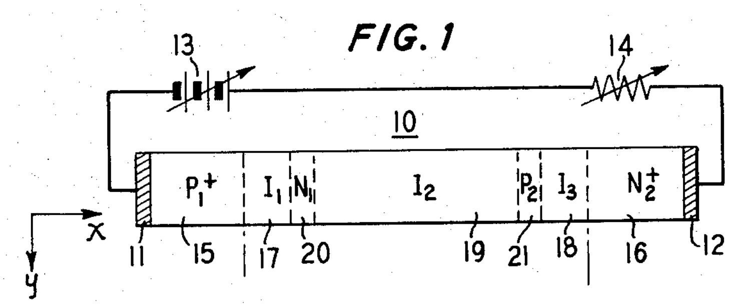
FIG. 1 is a schematic electrical circuit diagram including a P+INIPIN+ zone structured semiconductor diode according to one aspect of this invention.

FIG. 1 depicts a semiconductor diode 10 having a P+INIPIN+ type conductivity profile typically in a crystal of silicon, typically formed by epitaxial growth techniques which are known in the art. Due to impurity doping as known in the art, both of the outer end zones 15 and 16 advantageously have lower resistivity than any of the intervening zones therebetween in the diode 10. Therefore, the zone structure of the diode 10 is denoted by P+INIPIN+ in the drawing. The numerical subscripts in the designation of the various conductivity type zones in the diode 10 of FIG. 1 are merely for the purpose of identifying these zones in connection with FIGS. 2 and 3.

Terminal contacts for the diode 10 are furnished by the ohmic electrodes 11 and 12. The diode 10 is electrically connected through these electrodes 11 and 12 to the rest of the circuit, comprising the battery 13 and the variable resistor load 14, as shown in FIG. 1. The terminals of the battery 13 are arranged as shown to furnish a negative voltage to the end zone 15 of strongly P-type conductivity, and a positive voltage bias to the end zone 16 of strongly N-type conductivity; thereby, a reverse bias is applied to these end zones 15 and 16. The net impurity concentration in both end zones 15 and 16 typically are large enough to make these zones "degenerate"; that is, of very low resistivity compared with the remainder of the zones 17 through 21. For example, concentrations of $10^{20}$ or more net impurity atoms per cm.$^3$ are typical in end zones 15 and 16; whereas concentrations of the order of $10^{16}$ per cm.$3^3$ are typical in the intermediate zones 20 and 21; it being understood that donor impurities predominate in N-type zones 16 and 20, whereas acceptor impurities predominate in P-type zones 15 and 21.

Figure 2:
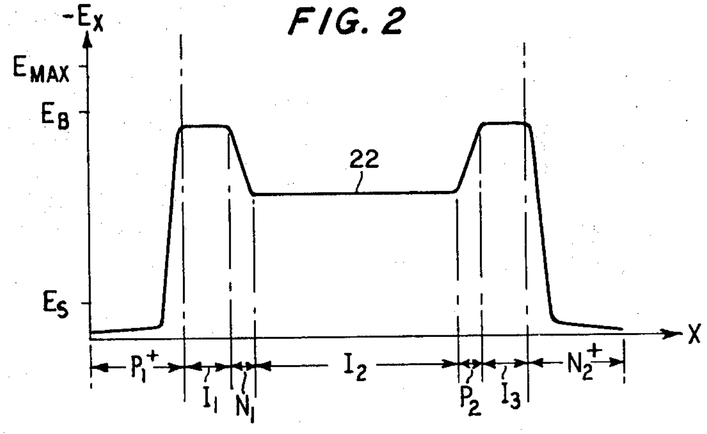
FIG. 2 is a plot of the electric field strength vs. distance in the diode shown in FIG. 1, in operation just before avalanche breakdown.
Figure 3:
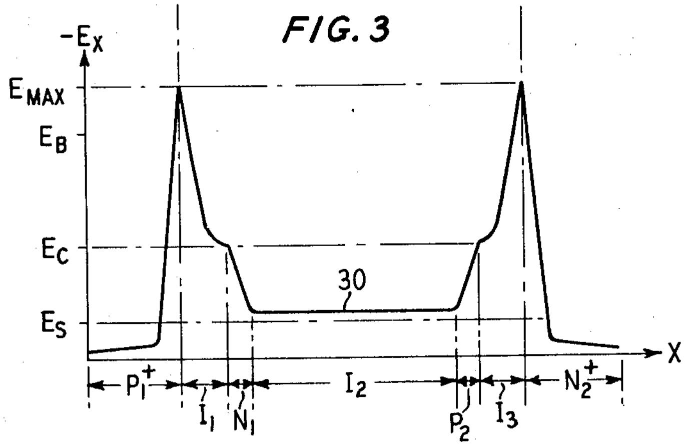
FIG. 3 is a plot of the electric field strength vs. distance in the diode shown in FIG. 1, in operation just after avalanche breakdown.

In operation of the diode 10, as the voltage of the battery 13 is increased from zero, the $x$ component of the electric field generally increased in this semiconductor diode 10, until the electric field profile reaches the configuration illustrated by curve 22 shown in FIG. 2, just before any avalanche breakdown occurs. As seen in FIG. 2, the electric field in the intermediate I-type zones 17 and 18 are slightly below the value $E_B$, the breakdown field. As the voltage of the battery 13 is further increased, avalanche breakdown occurs in the intermediate zones 17 and 18; and the electric field profile shown by curve 30 in FIG. 3 is established in the diode 10. It should be understood that FIGS. 2 and 3 represent ideal curves, under the assumptions that the mobility of electrons and holes are equal (especially in FIG. 3); and that the left-hand portion of the diode 10 is a mirror image of the right-hand portion thereof, in the sense that P-type semiconductor and N-type semiconductor are mutually mirror images of each other.

As known in the art, the electric field profiles shown in FIGS. 2 and 3 are determined by Poisson's equation:

$$\mathrm{div}(\epsilon E) = Q \qquad (1)$$

where $Q$ is the charge density. Also, as known in the art, $Q$ includes both the space charge due to moving free charge carriers as well as the space charge due to ionization of fixed impurity atoms. Thus, the charge density $Q$ completely determines the slope of the electric field in one-dimensional cases involving a uniform dielectric constant $\epsilon$. In turn, the space charge density at a point due to ionization of fixed atoms is a function of the net significant impurity concentration ("-doping"). Thus, parameters may be selected for the widths in the $x$ direction and doping concentrations of the various zones 15 through 21, in order to achieve any preselected electric field profile (at least before avalanche breakdown occurs).

In order to understand the negative resistance furnished by the diode 10, it should first be kept in mind that the area under the curve 22 is equal to the voltage drop across the diode 10 just before breakdown, whereas the area under the curve 30 represents the voltage drop across the diode 10 just after breakdown. Thus, the negative resistance of the diode 10 is attributable to the fact that the area under the curve 22 (before breakdown) is much greater than the area under the curve 30 (during breakdown), whereas the current before breakdown is much smaller than the current during breakdown.

An appreciation of the relatively large magnitude of the voltage drop just before vs. during breakdown may be realized from the following considerations. During avalanche, as indicated in FIG. 3, the maximum value of the electric field, $E_{MAX}$, in the intermediate I-type zones 17 and 18 will only slightly be above the breakdown field $E_B$. The reason why the value of $E_{MAX}$ is not much greater than $E_B$ is that the multiplication factor in silicon for avalanche advantageously is highly nonlinear. Thus, large increases in avalanche current result from relatively small increases in the electric field above the value $E_B$.

The electric field during avalanche will adjust itself to $E_C$ at the interfaces of zones 17 with zone 20 and zone 18 with zone 21, as indicated in FIG. 3; where $E_C$ is that value of electric field above which the avalanche multiplication factor is greater than zero. Moreover, the electric field in the central I-zone 19 during avalanche advantageously is adjusted to be only slightly above the saturation electric field $E_S$, in order to minimize the voltage drop during avalanche. This adjustment is achieved by appropriate selection of the width and doping of the intermediate N- and P-type zones, 20 and 21. By the saturation electric field is meant that value of the electric field above which the velocity of charge carriers does not significantly increase with increasing electric field strength.

In the intermediate N- and P-type zones, 20 and 21 respectively, due to the ionization of fixed impurity atoms, there is a steep slope in the electric field; thereby, the electric field in the central I-type zone 19 is substantially below that which would have been present thereat in the absence of these intermediate zones 20 and 21. The presence of the N- and P-zones 20 and 21 thereby increases the ratio of the area under the curve 22 to the area under the curve 30 from what this ratio would have been in the absence of these intermediate zones 20 and 21. Thus, the efficiency of the semiconductor diode 10 is greatly increased over the ordinary PIN-type conductivity profile avalanche diodes of the prior art. Indeed, by increasing the width of the central I-zone 19 to arbitrarily high values, arbitrarily high efficiencies can be obtained. However, it should be recognized that the transport time of carriers across the diode 10 will also be increased by this increase in width of the central I-zone 19. Thus, although arbitrarily high efficiencies can be obtained by increasing the width of the central I-zone 19, such efficiencies will result in lowering the upper cutoff frequency of operation of the diode 10 in conjunction with AC sources (not shown). Likewise, higher efficiencies can be obtained by lowering the value of the electric field in the central I-zone 19, but at the expense of lower drift velocity and hence, again lower cutoff frequency of operation.

Typical value for the width of the central I-type zone 19 range from 5 to 100 microns or more; whereas typical values for the widths of the intermediate I-type zones 17 and 18 range from 1 to 5 microns. The widths of the intermediate N- and P-type zones 20 and 21 advantageously are chosen to be smaller than the widths of the adjacent intermediate I-type zones 17 and 18, respectively. These widths of zones 20 and 21 are selected according to criteria set forth in the following paragraph.

It should be understood from inspection of curve 30 that, in accordance with Poisson's Eq. (1) above, the mathematical product of the width of N-type zone 20 and the net significant (donor) impurity concentration therein advantageously is slightly less than $\epsilon(E_C-E_S)$. The same relation holds true for P-type zone 20 with respect to the net significant acceptor impurity concentration therein. Thus, each of the widths of the N- and P-type zones 20 and 21, together with $\epsilon(E_C-E_S)$, determines the desirable doping concentration in each of these zones.

As described in the prior art, for example, U.S. Pat. No. 3,270,293 issued on Aug. 30, 1966 to B. C. DeLoach et al. and U. S. Pat. No. 3,356,866 issued on Dec. 5, 1967 to T. Misawa; negative resistance diodes in general and hence, also the diode 10 of the present invention, may be incorporated in waveguide structures in order to function as oscillator, amplifier, or parametric devices.

Figure 4:
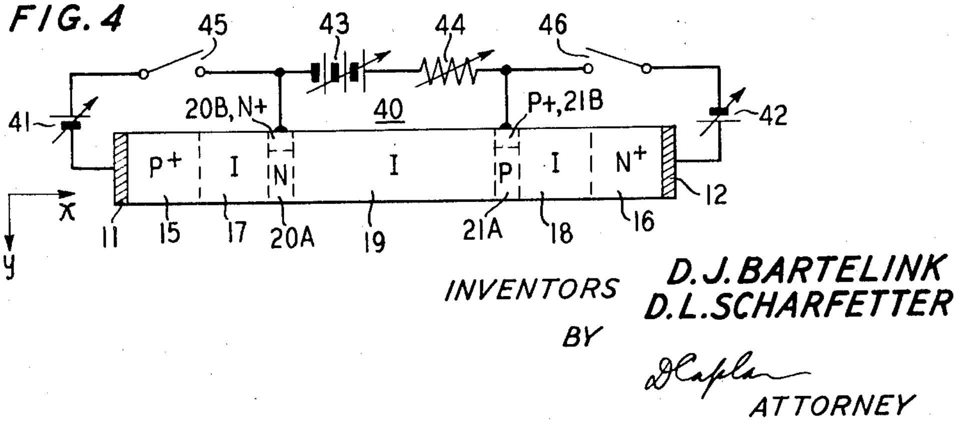
FIG. 4 is a circuit diagram including P+INIPIN+ zone structured semiconductor according to another present aspect of this invention.

FIG. 4 depicts a modified form of a semiconductor body 40 having a P+INIPIN+-type conductivity profile, in accordance with another aspect of this invention for use as an electronic switch. The silicon semiconductor body 40 is identical in all respects to the diode 10 described above, except for the fact that the zones 20 and 21 in diode 10 are split respectively into the zones 20A, 20B, and zones 21A, 21B in the semiconductor 40. Zones 20A and 21A have the same net significant impurity concentrations as zones 20 and 21, respectively, as previously discussed in connection with FIG. 1; but zones 20B and 21B have much higher net significant impurity concentrations, typically so much higher as to be degenerate. Thereby, zones 20B and 21B serve as terminal zones for the ohmic connection thereto of external lead wires to the rest of the circuit, as shown in FIG. 4.

The battery 43 and the variable resistor load 44 are initially adjusted to a value such that the bias electric field in the semiconductor 40 is just below the value at which avalanche breakdown would occur when the switches 45 and 46 are open. The switches 45 and 46 typically are themselves electronic type switches, such as well-known transistor switching devices or circuits. On the other hand, the batteries 41 and 42 are adjusted so that (in accordance with the particular desired operation) when either or both of the switches 45 and 46 are closed (advantageously but not necessarily simultaneously) avalanche breakdown occurs in either or both of the two PIN type diodes in the body 40; that is, in the one PIN diode formed by zones 15, 17, 20A, and the other formed by zones 21A, 18, 16. In turn, this avalanche quickly spreads and propagates downwards in the $y$ direction as indicated at the left-hand side of FIG. 4; and thereby produces a high current in the load resistor 44, as desired in an electronic switch. It should be understood that the power dissipated in the switches 45 and 46 is much lower than the power dissipated in the load 44; thereby, high efficiency is obtained.

Although this invention has been described in terms of a silicon semiconductor, other semiconductors may be used such as germanium or gallium arsenide, so long as the desired structure can be realized. Advantageously, the semiconductor should have a highly nonlinear avalanche multiplication factor, so that relatively small changes in the electric field can produce relatively large changes in current just before vs. during avalanche.

Although this invention has been described in terms of specific embodiments with specific widths and doping concentrations in various semiconductive zones, it should be obvious to the worker of ordinary skill in the art that many modifications are possible within the scope of the invention.

We claim:

1. A negative resistance semiconductive device comprising a semiconductor element having a PINIPIN-conductivity-type zone structure in which the width of at least one of the intermediate I-zones contiguous an other end zone is greater than the width of the P- or N-type intermediate zone contiguous said one of the intermediate I-zones.

2. The device recited in claim 1 in which there are further provided electrode connections to each of the outer end zones in said structure.

3. The device recited in claim 2 in combination with means for applying a reverse bias voltage to the semiconductor element through the electrode connections.

4. The device recited in claim 1 in which the semiconductor element is essentially silicon.

5. The device recited in claim 4 in which the width of the central said I-zone is between 5 and 100 microns, the widths of both of the other intermediate said I-zones is between 1 and 5 microns, and the widths of the intermediate said P- and N-zones both are less than the widths of either of said intermediate I-zones.

6. The device of claim 4 in which the net significant donor impurity concentration in the intermediate N-zone is of the order of $10^{16}$ per cm.$^3$, and the net significant acceptor impurity concentration in the intermediate P-zone is of the order of $10^{16}$ per cm.$^3$.

7. Semiconductive switching apparatus including the device according to claim 2 in combination with electrically conductive means to connect the intermediate N-zone serially through a switch and a voltage source to the outer P-type end zone in said structure.

8. Semiconductive switching apparatus including the device according to claim 2 in combination with electrically conductive means to connect the intermediate P-zone serially through a switch and a voltage source to the outer N-type end zone in said structure.